United States Patent [19]

Oida

[11] Patent Number: 4,560,888
[45] Date of Patent: Dec. 24, 1985

[54] HIGH-SPEED ECL SYNCHRONOUS LOGIC CIRCUIT WITH AN INPUT LOGIC CIRCUIT

[75] Inventor: Yoshio Oida, Funabashi, Japan

[73] Assignee: Tokyo Shibaura Denki Kabushiki Kaisha, Kawasaki, Japan

[21] Appl. No.: 518,454

[22] Filed: Jul. 29, 1983

[30] Foreign Application Priority Data

Aug. 3, 1982 [JP] Japan .................. 57-135401

[51] Int. Cl.[4] .................... H03K 3/289
[52] U.S. Cl. ................ 307/272 A; 307/291; 307/443; 307/455
[58] Field of Search .............. 307/443, 454, 455, 467, 307/272 R, 291; 307/272 A

[56] References Cited

U.S. PATENT DOCUMENTS

| | | | |
|---|---|---|---|
| 3,917,961 | 11/1975 | Reed | 307/272 A X |
| 3,996,478 | 12/1976 | Kasperkovitz | 307/291 X |
| 4,041,326 | 8/1977 | Robinson | 307/455 X |
| 4,237,387 | 12/1980 | Devendorf et al. | 307/455 |
| 4,309,625 | 1/1982 | Takahashi | 307/272 A |

FOREIGN PATENT DOCUMENTS 2046544 11/1980 United Kingdom ............ 307/465

Primary Examiner—Stanley D. Miller
Assistant Examiner—D. R. Hudspeth
Attorney, Agent, or Firm—Finnegan, Henderson, Farabow, Garrett & Dunner

[57] ABSTRACT

An input logic circuit has a plurality of pairs of bipolar transistors. The base of each pair of transistors receive a logic signal and its inverted signal, respectively, and the emitters thereof are coupled to each other. A signal transfer circuit has a pair of bipolar transistors the emitters of which are coupled to each other and the base of which respectively receive an output signal and its inverted output signal from the input logic circuit. The signal transfer circuit is operated in response to a synchronizing signal. A signal hold circuit has a pair of bipolar transistors arranged such that their emitters are connected to each other, their bases and collectors are cross-coupled, and their bases respectively receive an output signal and its inverted output signal from the signal transfer circuit. The signal hold circuit is operated in response to the synchronizing signal. The signal transfer circuit and the signal hold circuit constitute an ECL synchronous latch.

2 Claims, 12 Drawing Figures

4,560,888

HIGH-SPEED ECL SYNCHRONOUS LOGIC CIRCUIT WITH AN INPUT LOGIC CIRCUIT

BACKGROUND OF THE INVENTION

The present invention relates to an emitter-coupled logic (to be referred to as an ECL hereinafter) synchronous logic circuit using bipolar transistors.

In an ECL synchronous logic circuit, the bipolar transistors arranged therein switch in an unsaturated state to achieve high-speed switching.

In a logic circuit such as a synchronous latch and a synchronous flip-flop used for synchronizing a given signal with a synchronizing signal, an input logic circuit is often arranged at a signal input terminal of the above-described latch or flip-flop so as to obtain a predetermined logic signal from a plurality of signals.

For example, as shown in a block diagram of FIG. 1, an input logic circuit 15 having AND gates 12 and 13 and an OR gate 14 is arranged to supply to an signal input terminal IN of a synchronous latch 11 one of logic signals A and B in accordance with the logic level of a selection signal C. The selected signal from the input logic circuit 15 is produced from output terminals D and $\overline{D}$, respectively, of the latch 11 in response to a synchronizing signal supplied to a synchronizing signal input terminal CK of the latch 11. FIG. 2 is a block diagram of a conventional input logic circuit 15 having only an OR gate 16. The OR gate 16 receives two logic signals A and B. In order to synchronize an input signal with a synchronizing signal, a synchronous flip-flop may be used in place of the synchronous latch 11. In the conventional synchronous logic circuit having the input logic circuit at its signal input terminal, high-speed switching cannot be performed. In addition to this disadvantage, the number of circuit elements is great, and power consumption is high.

SUMMARY OF THE INVENTION

It is, therefore, an object of the present invention to provide a high-speed ECL synchronous logic circuit having an input logic circuit and a small number of circuit elements, thus resulting in low power consumption.

In order to achieve the above object of the present invention, there is provided an ECL synchronous logic circuit comprising:

first and second bipolar transistors the bases of which receive synchronizing signals having opposite phases and the emitters of which are coupled to each other;

an input logic circuit having a plurality of pairs of bipolar transistors, each pair having emitters coupled to each other and bases respectively receiving a logic input signal and an inverted logic input signal, one of said plurality of pairs having an emitter-coupling node connected to a collector of said first bipolar transistor; and a signal hold circuit having third and fourth bipolar transistors arranged such that emitters thereof are coupled to each other, bases and collectors thereof are cross-coupled, the bases thereof respectively receive an output signal and an inverted output signal from said input logic circuit, and an emitter-coupling node thereof is connected to a collector of said second bipolar transistor.

DETAILED DESCRIPTION OF THE PREFERRED EMBODIMENTS

Figure 3:
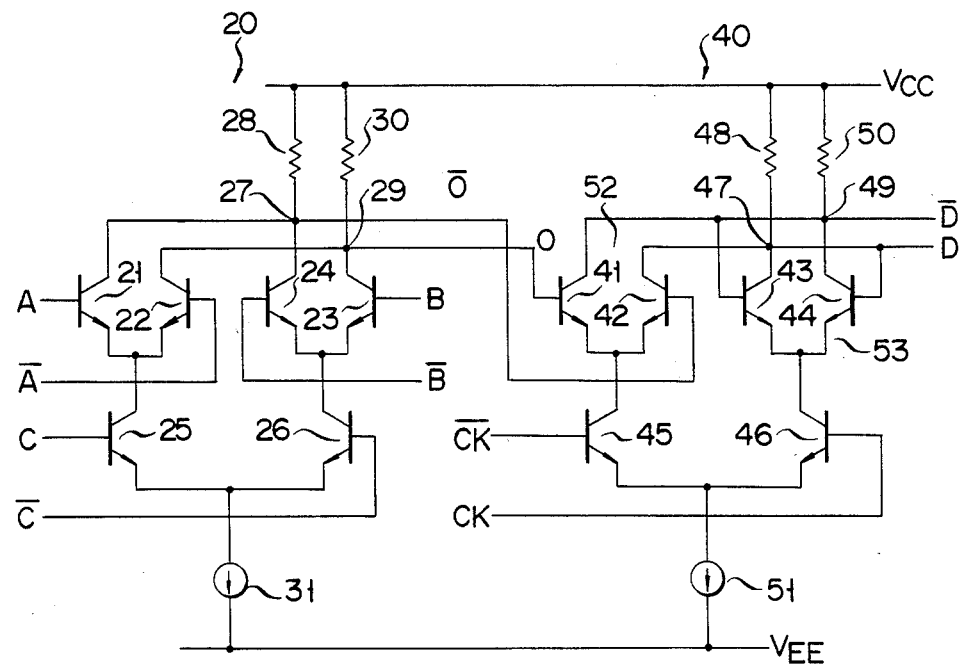
FIG. 3 is a circuit diagram of an ECL synchronous logic circuit according to an embodiment of the present invention.

FIG. 3 is a circuit diagram of an ECL synchronous logic circuit according to an embodiment of the present invention. The ECL synchronous logic circuit comprises a synchronous latch 40 operated in response to synchronizing signals CK and $\overline{CK}$ which have opposite phases, and an input logic circuit 20 arranged to supply signals to the synchronous latch 40.

Figure 1:
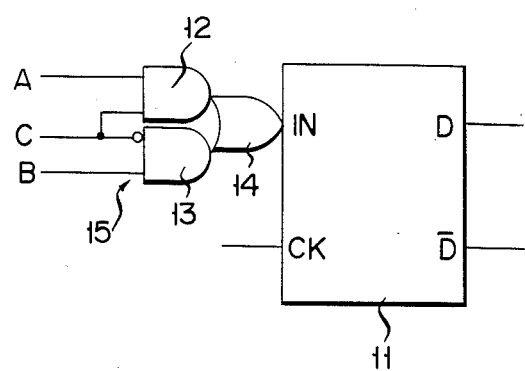
FIG. 1 is a block diagram showing an example of a synchronous latch having an input logic circuit at its signal input terminal.

The input logic circuit 20 selects one of logic signals A and B in accordance with a selection signal C in the same manner as does the input logic circuit 15 (FIG. 1), and has a circuit configuration as follows. The bases of a pair of bipolar npn transistors 21 and 22 receive the logic signal A and its inverted signal $\overline{A}$, respectively, and the emitters thereof are coupled to each other. Similarly, the bases of a pair of bipolar npn transistors 23 and 24 receive the logic signal B and its inverted signal $\overline{B}$, respectively, and the emitters thereof are coupled to each other. In the same manner as described above, the bases of a pair of bipolar npn transistors 25 and 26 receive the selection signal C and its inverted signal $\overline{C}$, respectively, and emitters thereof are coupled to each other. The collectors of the transistors 21 and 24 are coupled to each other to constitute a coupling node 27. A resistor 28 is connected as a common load of the npn transistors 21 and 24 between the coupling node 27 and a high voltage $V_{CC}$. The collectors of the transistors 22 and 23 are coupled to each other to constitute a coupling node 29. A resistor 30 is connected as a common load of the transistors 22 and 23 between the coupling node 29 and the high voltage $V_{CC}$. The collector of the transistor 25 is connected to the emitter-coupling node of the transistors 21 and 22. In a similar manner, the collector of the transistor 26 is connected to the emitter-coupling node of the transistors 23 and 24. A current source 31 having a resistor, etc., is connected between a low voltage $V_{EE}$ and the emitter-coupling node of the transistors 25 and 26.

The synchronous latch 40 serves to produce signals D and $\overline{D}$ in response to a synchronizing signal CK in accordance with output signals O and $\overline{O}$, respectively, obtained from the nodes 29 and 27 as signal output terminals of the input logic circuit 20. The synchronous latch 40 has the following circuit configuration. The bases of a pair of bipolar npn transistors 41 and 42 receive the signals O and $\overline{O}$, respectively, and the emitters thereof are coupled to each other. The base of a bipolar npn transistor 43 is connected to the collector of the transistor 41, and the base of a bipolar npn transistor 44 is connected to the collector of the transistor 42. The emitters of the bipolar transistors 43 and 44 are coupled to each other, and the bases and collectors thereof are cross-coupled. The bases of a pair of bipolar npn transistors 45 and 46, respectively, receive synchronizing signals CK and $\overline{CK}$ which are of opposite phases, and the emitters thereof are coupled to each other. The collectors of the transistors 42 and 43 are connected to each other to constitute a coupling node 47. A resistor 48 is connected as a common load of the transistors 42 and 43 between the node 47 and the high voltage $V_{CC}$. The collectors of the transistors 41 and 44 are connected to each other to constitute a coupling node 49. A resistor 50 is connected as a common load of the transistors 41 and 44 between the node 49 and the high voltage $V_{CC}$. The collector of the transistor 45 is connected to the emitter-coupling node of the bipolar transistors 41 and 42. Similarly, the collector of the transistor 46 is connected to the emitter-coupling node of the transistors 43 and 44. Furthermore, a current source 51 having a resistor, etc., is connected between the low voltage $V_{EE}$ and the emitter-coupling node of the transistors 45 and 46. The nodes 47 and 49 serve as signal output terminals of the synchronous latch 40. Signals D and $\overline{D}$ are produced from the nodes 47 and 49, respectively.

In the synchronous latch 40, the transistors 41 and 42 and the resistors 48 and 50 constitute a signal transfer circuit 52 which becomes operative when the synchronizing signal $\overline{CK}$ is set at level "1" or binary "1". The synchronous latch 40 also has a signal hold circuit 53 consisting of the transistors 43 and 44 and the resistors 48 and 50 for latching an output signal from the transfer circuit 52.

The operation of the ECL synchronous logic circuit having the construction described above will be described hereinafter. Assume that the selection signal C is set at logic level "1" corresponding to the high voltage $V_{CC}$, and that the inverted selection signal $\overline{C}$ is set at logic level "0" corresponding to the low voltage $V_{EE}$. The transistor 25 is ON, while the transistor 26 is OFF. The transistors 21 and 22 which respectively receive the logic signals A and $\overline{A}$ are rendered conductive (i.e., collector currents can flow therethrough). When the logic signal A is set at level "1" and the signal $\overline{A}$ is set at level "0", the transistor 21 is turned on, while the transistor 22 is turned off. As a result, the output signal O from the input logic circuit 20 is set at level "1", and the inverted output signal $\overline{O}$ is set at level "0". However, when the signals A and $\overline{A}$ are set at levels "0" and "1", respectively while the transistor 25 is ON, the transistor 21 is turned off and the transistor 22 is turned on. As a result, the signal O from the input logic circuit 20 becomes set at level "0", and the signal $\overline{O}$ therefrom becomes set at level "1". In brief, when the signal C is set at level "1", the logic signal $\overline{A}$ and its inverted signal A are respectively produced as the output signal O and the inverted output signal $\overline{O}$ from the input logic circuit 20.

However, in the input logic circuit 20, when the signal C is set at level "0" and the inverted logic signal $\overline{C}$ is set at level "1", the transistor 25 is turned off and the transistor 26 is turned on. In this case, the transistors 23 and 24 which respectively receive the logic signals B and $\overline{B}$ are rendered conductive (i.e., collector currents can flow therethrough). Under this condition, when the logic signal B is set at level "1" and its inverted signal $\overline{B}$ is set at level "0", the transistor 23 is turned on and the transistor 24 is turned off. As a result, the output signal O from the input logic circuit 20 becomes set at level "1", and the inverted output signal $\overline{O}$ becomes set at level "0". However, when the signal B is set at level "0" and the inverted signal $\overline{B}$ is set at level "1" while the transistor 26 is ON, the transistor 23 is turned off, and the transistor 24 is turned on. As a result, the output signal O from the input logic circuit 20 becomes set at level "0", and the inverted output signal $\overline{O}$ therefrom becomes set at level "1". In brief, when the signal $\overline{C}$ is set at level "1", the logic signal $\overline{B}$ and its inverted logic signal B are respectively produced as the output signal O and the inverted output signal $\overline{O}$ from the input logic circuit 20.

In the synchronous latch 40, assume that the synchronizing signal $\overline{CK}$ is set at level "1", and that the synchronizing signal CK is set at level "0". Under this condition, the transistor 45 is ON, and the transistor 46 is OFF. The transistors 41 and 42 of the transfer circuit 52 are rendered conductive (i.e., collector currents can flow therethrough). When the output signal O from the input logic circuit 20 is set at level "1" and the inverted output signal $\overline{O}$ is set at level "0", the transistor 41 is turned on, and the transistor 42 is turned off. As a result, the output signal D and its inverted signal $\overline{D}$ from the nodes 47 and 49 become set at levels "1" and "0", respectively. While the synchronizing signal $\overline{CK}$ is set at level "1", the output signal O and its inverted output signal O respectively appear at the nodes 47 and 49 in inverted states.

When the synchronizing signal $\overline{CK}$ is set at level "0" and the synchronizing signal CK is set at level "1", the transistor 45 is turned off, and the transistor 46 is turned on. The transistors 43 and 44 in the signal hold circuit 53 are rendered conductive (i.e., collector currents can flow therethrough). Assume that the signals D and $\overline{D}$ are set at levels "1" and "0", respectively, while the preceding synchronizing signal $\overline{CK}$ is set at level "1". Under this condition, when the synchronizing signal CK is set at level "1" to turn on the transistor 46, the transistor 44 is turned on in response to the signal D, and the transistor 43 is turned off in response to the signal $\overline{D}$. The signals $\overline{D}$ and D at the nodes 49 and 47 are set at levels "0" and "1", respectively. The nodes 49 and 47 which are respectively connected to the collectors of the transistors 44 and 43 are also respectively connected to the bases of the transistors 43 and 44, and the signals at the nodes 49 and 47 are stably held by the transistors 44 and 43, respectively.

In the synchronous latch 40, the output signal O and its inverted signal $\overline{O}$ are inverted and transferred to the signal hold circuit 53 through the transfer circuit 52 while the synchronizing signal $\overline{CK}$ is set at level "1". The signals transferred through the transfer circuit 52 are stably held in the signal hold circuit 53 while the synchronizing signal CK is set at level "1". The transistors 43 and 44 in the signal hold circuit 53 are rendered conductive (i.e., collector currents can flow therethrough) while the synchronizing signal CK is set at level "1". Therefore, the signals D and $\overline{D}$ from the synchronous latch 40 are synchronized with the synchronizing signal CK.

In the above embodiment, an ECL circuit arrangement is used wherein the input logic circuit 20 and the synchronous latch 40 each comprise a pair of transistors having emitters coupled to each other. Therefore, high-speed operation, as the main feature of the ECL circuit, can be achieved. Further, if the frequencies of the synchronizing signals $\overline{CK}$ and CK are sufficiently high, the circuit can be stably operated.

Figure 2:
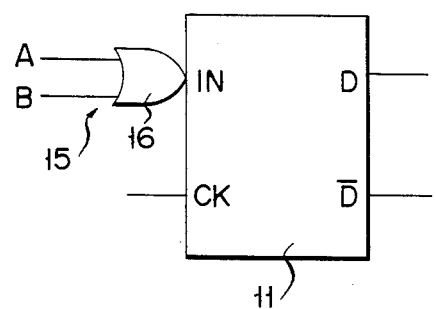
FIG. 2 is a block diagram showing another example of a synchronous latch having an input logic circuit at its signal input terminal.
Figure 4:
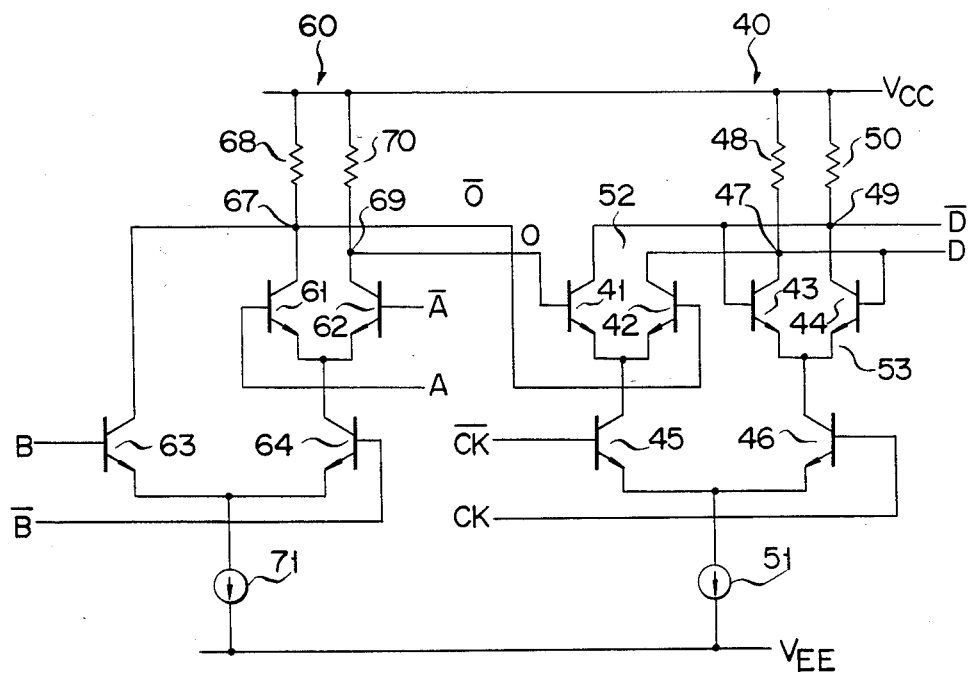
FIGS. 4 to 10 are circuit diagrams of respective ECL synchronous logic circuits according to various other embodiments of the present invention.

FIG. 4 is a circuit diagram of an ECL synchronous logic circuit according to another embodiment of the present invention. In the ECL synchronous logic circuit of this embodiment, an input logic circuit 60 in place of the input logic circuit 20 (FIG. 3) is connected to a signal input terminal of a synchronous latch circuit 40. The input logic circuit 60 has an OR function which serves to select one of the logic signals A and B in the same manner as the input logic circuit 15 (FIG. 2). The synchronous latch 40 has the same arrangement as that in FIG. 3. The same reference numerals used in FIG. 3 denote the same parts in FIG. 4.

The input logic circuit 60 has the following arrangement. The bases of a pair of bipolar npn transistors 61 and 62 receive the logic signal A and its inverted signal $\overline{A}$, respectively, and the emitters thereof are coupled to each other. Similarly, the bases of a pair of bipolar npn transistors 63 and 64 receive the logic signal B and its inverted signal $\overline{B}$, respectively, and the emitters thereof are coupled to each other. The collectors of the transistors 61 and 63 are connected to each other to constitute a coupling node 67. A resistor 68 is connected as a common load of the transistors 61 and 63 between the node 67 and a high voltage $V_{CC}$. A resistor 70 is connected as a load of the transistor 62 between the high voltage $V_{CC}$ and a coupling node 69 connected to the collector of the transistor 62. The collector of the bipolar transistor 64 is connected to the emitter-coupling node of the pair of transistors 61 and 62. A current source 71 having a resistor, etc., is connected between a low voltage $V_{EE}$ and the emitter-coupling node of the pair of transistors 63 and 64.

In the circuit having the construction described above, assume that the signal A, among the logic signals, to be supplied to the input logic circuit 60 is set at level "1". In this case, the signal $\overline{A}$ is set at level "0", the signal B is set at level "0", and the signal $\overline{B}$ is set at level "1". Therefore, the transistors 61 and 64 are ON, and the transistors 62 and 63 are OFF. As a result, a signal $\overline{O}$ at the node 67 is set at level "0", and a signal O at the node 69 is set at level "1". However, assume that the signal B is set at level "1". In this case, the signal A is set at level "0", the signal $\overline{A}$ is set at level "1", and the signal $\overline{B}$ is set at level "0". The transistors 62 and 63 are ON, and the transistors 61 and 64 are OFF. As a result, the signal $\overline{O}$ at the node 67 is set at level "0", and the signal O at the node 69 is set at level "1". On the other hand, when the signals A and B are set at level "1", their inverted signals $\overline{A}$ and $\overline{B}$ are set at level "0". In this case, the transistors 61 and 63 are turned on, and the transistors 62 and 64 are turned off. Therefore, the signal $\overline{O}$ at the node 67 is set at level "0", and the signal O at the node 69 is set at level "1". However, when the signals A and B are set at level "0", their inverted signals $\overline{A}$ and $\overline{B}$ are set at level "1". In this case, the transistors 61 and 63 are turned off, and the transistors 62 and 64 are turned on. Therefore, the signal $\overline{O}$ at the node 67 becomes set at level "1", and the signal O at the node 69 becomes set at level "0". In this manner, the input logic circuit 60 serves as a 2-input OR gate. The output signal O and its inverted output signal $\overline{O}$ from the input logic circuit 60 are inverted and transferred to a signal hold circuit 53 through a transistor circuit 52 while the synchronizing signal $\overline{CK}$ is set at level "1" in the same manner as in the circuit shown in FIG. 3. The transferred signals are stably held in the signal hold circuit 53 while the synchronizing signal CK is set at level "1". Therefore, the signals D and $\overline{D}$ from the synchronous latch 40 are synchronized with the synchronizing signal CK. Furthermore, since the input logic circuit 60 and the synchronous latch 40 comprise ECL circuits, respectively, high-speed operation as the main feature of the ECL circuit can be achieved.

In the circuit shown in FIG. 3 or 4, the input logic circuit 20 or 60 and the synchronous latch 40 are arranged independently of each other. For this reason, the number of circuit elements is large and the ECL synchronous logic circuit has a high power consumption. Furthermore, in the circuit shown in FIG. 3 or 4, when the input logic circuit 20 or 60 receives the logic signals A, B and C or the logic signals A and B, the signals O and $\overline{O}$ are continuously produced. However, when the synchronizing signal $\overline{CK}$ is set at level "0", the transfer circuit 52 in the synchronous latch 40 is not operative. Therefore, while the transfer circuit 52 is held inoperative, the signals O and $\overline{O}$ may take any logic level.

Figure 5:
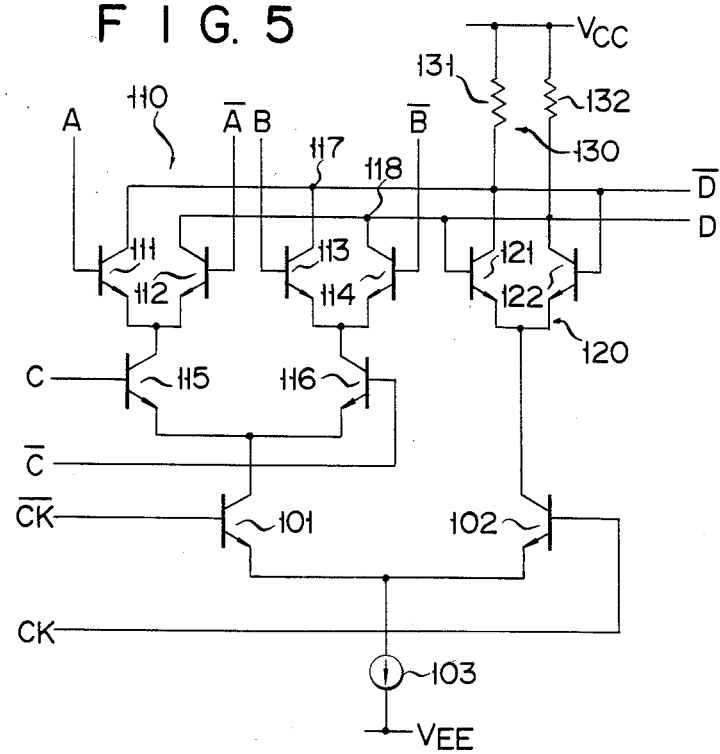

FIG. 5 is a circuit diagram of an ECL synchronous logic circuit according to still another embodiment of the present invention. In the circuit of this embodiment, because the signals O and $\overline{O}$ may have any logic level while the synchronizing signal $\overline{CK}$ is set at level "0", the number of circuit elements and power consumption are decreased, compared with the circuit shown in FIG. 3.

The ECL synchronous logic circuit of this embodiment includes: a pair of bipolar npn transistors 101 and 102 the bases of which respectively receive the synchronizing signals $\overline{CK}$ and CK and the emitters of which are coupled to each other; an input logic circuit 110; a signal hold circuit 120; and a load circuit 130 commonly used for the input logic circuit 110 and the signal hold circuit 120.

The input logic circuit 110 has the following arrangement. The bases of a pair of bipolar npn transistors 111 and 112 receive a logic signal A and its inverted signal $\overline{A}$, respectively, and the emitters thereof are coupled to each other. Similarly, the bases of a pair of bipolar npn transistors 113 and 114 receive a logic signal B and its inverted signal $\overline{B}$, respectively, and the emitters thereof are coupled to each other. In the same manner as described above, the bases of a pair of bipolar npn transistors 115 and 116 receive a selection signal C and its inverted signal $\overline{C}$, respectively, and the emitters thereof are coupled to each other. The collectors of the transistors 111 and 113 are connected to a node 117. Similarly, the collectors of the transistors 112 and 114 are connected to a node 118. The collector of the transistor 115 is connected to the emitter-coupling node of the pair of transistors 111 and 112. The collector of the transistor 116 is connected to the emitter-coupling node of the pair of transistors 113 and 114. The collector of the transistor 101 is connected to the emitter-coupling node of the pair of transistors 115 and 116.

The signal hold circuit 120 has the following arrangement. The bases and collectors of a pair of bipolar npn transistors 121 and 122 are cross-coupled, and emitters thereof are coupled to each other. The base of the transistor 121 is connected to the node 118. The base of the transistor 122 is connected to the node 117.

The load circuit 130 comprises resistors 131 and 132. The resistor 131 is connected between the node 117 and a high voltage $V_{CC}$, and the resistor 132 is connected to the node 118 and the high voltage $V_{CC}$.

A current source 103 having a resistor and the like is connected between a low voltage $V_{EE}$ and the emitter-coupling node of the pair of transistors 101 and 102. Signals D and $\overline{D}$ synchronous with the synchronizing signal CK appear at the nodes 117 and 118, respectively.

In the circuit described above, when the synchronizing signal $\overline{CK}$ is set at level "1", the transistor 101 is turned on and is held in a state where a collector current thereof can flow therethrough. At the same time, the input logic circuit 110 is held operative. In this condition, when the selection signal C is set at level "1", the transistor 115 is turned on. The transistors 111 and 112 which receive the signals A and $\overline{A}$ are held operative (i.e., collector currents can flow therethrough). Under this condition, when the signal A is set at level "1" and the signal $\overline{A}$ is set at level "0", the transistor 111 is turned on and the transistor 112 is turned off. As a result, the signal $\overline{D}$ is set at level "0", and the signal D is set at level "1". However, when the signal A is set at level "0" and the signal $\overline{A}$ is set at level "1" while the transistor 115 is ON, the transistor 111 will be OFF and the transistor 112 will be ON. As a result, the signal $\overline{D}$ becomes set at level "1", and the signal D becomes set at level "0". In short, when the synchronizing signal $\overline{CK}$ is set at level "1" and the signal C is set at level "1", the logic signal A and its inverted signal $\overline{A}$ appear as the signals D and $\overline{D}$ at the nodes 118 and 117, respectively.

When the signal $\overline{C}$ is set at level "1" while the transistor 101 is ON, the transistor 116 is turned on. At the same time, the transistors 113 and 114 which receive the signals B and $\overline{B}$ are rendered conductive (i.e., collector currents can flow therethrough). In this condition, when the signal B is set at level "1" and the signal $\overline{B}$ is set at level "0", the transistor 113 is turned on, and the transistor 114 is turned off. As a result, the signal $\overline{D}$ becomes set at level "0", and the signal D becomes set at level "1". However, when the signal B is set at level "0" and the signal $\overline{B}$ is set at level "1" while the transistor 116 is ON, the transistor 113 is turned off, and the transistor 114 is turned on. In this case, the signal $\overline{D}$ is set at level "1", and the signal D is set at level "0". In brief, when the synchronizing signal $\overline{CK}$ is set at level "1" and the signal C is set at level "1", the logic signal B and its inverted signal $\overline{B}$ appear as the signals D and $\overline{D}$ at the nodes 118 and 117, respectively.

Subsequently, the synchronizing signal $\overline{CK}$ is set at level "0", and the synchronizing signal CK is set at level "1". The transistor 101 is then turned off and the transistor 102 is turned on. The transistor 102 is held in a state wherein a collector current can flow therethrough, and the transistors 121 and 122 in the signal hold circuit 120 are rendered operative (collector currents can flow therethrough). Assume that the signals $\overline{D}$ and D are set at levels "0" and "1", respectively, while the preceding synchronizing signal $\overline{CK}$ is set at level "1". When the transistor 102 is turned on, the transistor 121 is turned on in response to the signal D, and the transistor 122 is turned off in response to the signal $\overline{D}$. Therefore, the signals D and $\overline{D}$ at the nodes 118 and 117 are set at levels "1" and "0", respectively. Furthermore, in the signal hold circuit 120, the base of the transistor 121 is connected to the collector of the transistor 122, and the base of the transistor 122 is connected to the collector of the transistor 121. Therefore, the signals D and $\overline{D}$ are stably held in the signal hold circuit 120 while the synchronizing signal CK is set at level "1".

The input logic circuit 110 is held inoperative while the synchronizing signal CK is set at level "1" and the transistor 101 is held OFF. In this condition, signal selection is not performed. However, the signal from the input logic circuit 110 during this period need not be supplied to the signal hold circuit 120. Therefore, no problem occurs when the input logic circuit 110 is held inoperative.

In the circuit described above, the transistors 121 and 122 in the signal hold circuit 120 are rendered operative only while the synchronizing signal CK is set at level "1". Therefore, the signals D and $\overline{D}$ are synchronized with the synchronizing signal CK. Furthermore, the circuit of this embodiment is constituted by an ECL circuit arrangement consisting of a plurality of pairs of emitter-coupled transistors, thereby providing high-speed operation as the main feature of the ECL circuit. In comparison with the embodiment shown in FIG. 3, the circuit in FIG. 5 has 10 transistors while the circuit in FIG. 3 has 12 transistors. Furthermore, the circuit in FIG. 3 also has four resistors and two current sources. However, the circuit in FIG. 5 has only two resistors and one current source. Therefore, the number of circuit elements in the circuit in FIG. 5 is decreased compared with the circuit in FIG. 3. In general, the ECL logic circuit has current sources of an equal current. Therefore, since the circuit in FIG. 5 only uses one current source, power consumption can be decreased, as compared with that in the circuit in FIG. 3.

In the circuit shown in FIG. 3, the logic signal A ($\overline{A}$) or B ($\overline{B}$) is supplied to the signal hold circuit 53 through two signal inverting means. For example, the signal A is supplied to the signal hold circuit 53 through one inverter as a signal inverting means of the transistor 21 and the resistor 28 and through another inverter as another signal inverting means of the transistor 42 and the resistor 48. On the other hand, in the circuit shown in FIG. 5, the logic signal A ($\overline{A}$) or B ($\overline{B}$) is supplied to the signal hold circuit 120 through a single signal inverting means. For example, the signal A is supplied to the signal hold circuit 120 only through one inverter as the single signal inverting means of the transistor 111 and the resistor 131. Therefore, in the circuit in FIG. 5, delay time during signal transfer is caused only by the single inverter. The delay time of the circuit in FIG. 5 is therefore shorter than that of the circuit in FIG. 3.

Figure 6:
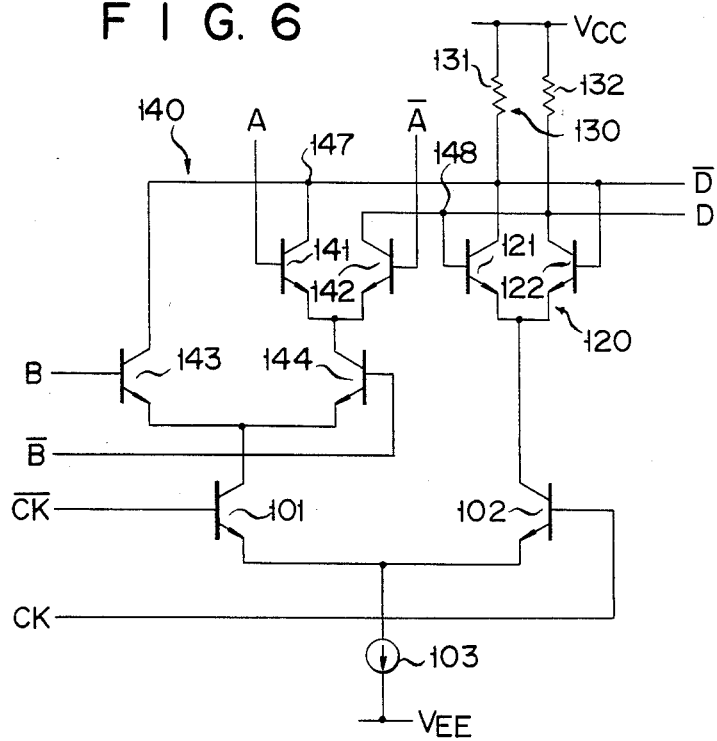

FIG. 6 is a circuit diagram of an ECL synchronous logic circuit according to still another embodiment of the present invention. Utilizing the fact that the signals O and $\overline{O}$ may take any logic level while the synchronizing signal $\overline{CK}$ is set at level "0" in the same manner as in the embodiment shown in FIG. 5, the number of elements and power consumption is smaller than in the circuit in FIG. 4.

In the ECL synchronous logic circuit in this embodiment, an input logic circuit 140 is used in place of the input logic circuit 110 in FIG. 5. The input logic circuit 140 has an OR function for selecting one of logic signals A and B in the same manner as the input logic circuit 15 in FIG. 2. Any other arrangement of the circuit in FIG. 5 is the same as that in FIG. 5. The same reference numerals as used in FIG. 5 denote the same parts in FIG. 6.

The input logic circuit 140 has the following arrangement. The bases of a pair of bipolar npn transistors 141 and 142 receive a logic signal $\overline{A}$ and its inverted signal A, respectively, and the emitters thereof are coupled to each other. Similarly, the bases of a pair of bipolar npn transistors 143 and 144 receive a logic signal B and its inverted signal $\overline{B}$, respectively, and the emitters thereof are coupled to each other. The collectors of the transistors 141 and 143 are connected to a node 147. The collector of the transistor 142 is connected to a node 148. The collector of the transistor 144 is connected to an emitter-coupling node of the pair of transistors 141 and 142. The collector of the transistor 101 is connected to the emitter-coupling node of the pair of transistors 143 and 144.

The collector of the transistor 121 of the signal hold circuit 120, the base of the transistor 122 thereof, and one end of a resistor 131 of a load circuit 130 are connected to the node 147. The collector of the transistor 122 in the signal hold circuit 120, the base of the transistor 121 thereof, and one end of a resistor 132 of the load circuit 130 are connected to the node 148.

In the circuit of the above embodiment, when the synchronizing signal $\overline{CK}$ is set at level "1", the transistor 101 is turned on, so that the input logic circuit 140 is rendered operative in the same manner as in FIG. 5. In this condition, one (e.g., signal A) of the signals A and B is set at level "1". At the same time, the signal $\overline{A}$ is set at level "0", the signal B is set at level "0", and the signal $\overline{B}$ is set at level "1". Therefore, the transistors 141 and 144 are turned on, and the transistors 142 and 143 are turned off. As a result, the signal $\overline{D}$ at the node 147 becomes set at level "0", and the signal D at the node 148 becomes set at level "1". However, when the signal B is set at level "1", the signal A is set at level "0", the signal $\overline{A}$ is set at level "1", and the signal $\overline{B}$ is set at level "0". In this case, the transistors 142 and 143 are turned on, and the transistors 141 and 144 are turned off. As a result, the signal $\overline{D}$ at the node 147 becomes set at level "0", and the signal D at the node 148 becomes set at level "1". However, when the signals A and B are set at levels "1", the signals $\overline{A}$ and $\overline{B}$ are set at level "0". The transistors 141 and 143 are turned on, and the transistors 142 and 144 are turned off. Therefore, the signal $\overline{D}$ at the node 147 is set at level "0", and the signal D at the node 148 is set at level "1". Subsequently, when the signals A and B are set at level "0", the transistors 141 and 143 are turned off, and the transistors 142 and 144 are turned on. The signal $\overline{D}$ at the node 147 is set at level "1", and the signal D at the node 148 is set at level "0". Therefore, the input logic circuit 140 serves as a 2-input OR gate while the synchronizing signal $\overline{CK}$ is set at level "1".

Subsequently, the synchronizing signal $\overline{CK}$ is set at level "0", and the synchronizing signal CK is set at level "1". In this case, the transistor 101 is turned off, and the transistor 102 is turned on. The transistor 102 is held in a state wherein a collector current can flow therethrough, so that the pair of transistors 121 and 122 in the signal hold circuit 120 is rendered operative. Thereafter, the output signals from the input logic circuit 140 are stably held in the signal hold circuit 120 while the synchronizing signal CK is set at level "1", in the same manner as in the circuit in FIG. 5.

In the circuit shown in FIG. 6, the pair of transistors 121 and 122 in the signal hold circuit 120 are rendered operative only while the synchronizing signal CK is set at level "1". Therefore, the signals D and $\overline{D}$ are synchronized with the synchronizing signal CK. The circuit shown in FIG. 6 has an ECL circuit arrangement consisting of a plurality of pairs of emitter-coupled transistors, thereby providing high-speed operation as the main feature of the ECL circuit. When the circuit in FIG. 6 is compared with that in FIG. 4, the former circuit (FIG. 4) has 10 transistors, whereas the latter circuit (FIG. 6) has only eight transistors. Furthermore, the circuit in FIG. 4 also has four resistors and two current sources, whereas the circuit in FIG. 6 has only two resistors and one current source. Thus, in the circuit shown in FIG. 6, the number of elements is smaller than in the circuit in FIG. 4. In addition to these advantages, since the circuit in FIG. 6 has only one current source (while the circuit in FIG. 4 has two current sources), the circuit in FIG. 6 has a lower power consumption than that of the circuit in FIG. 4, for the same reason as previously described. The delay time of the circuit in FIG. 6 is shorter than that of the circuit in FIG. 4 by the delay time corresponding to an inverter.

Figure 7A:
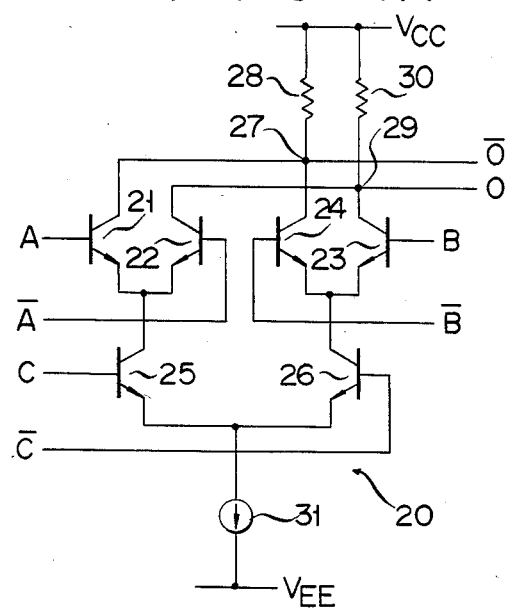
Figure 7B:
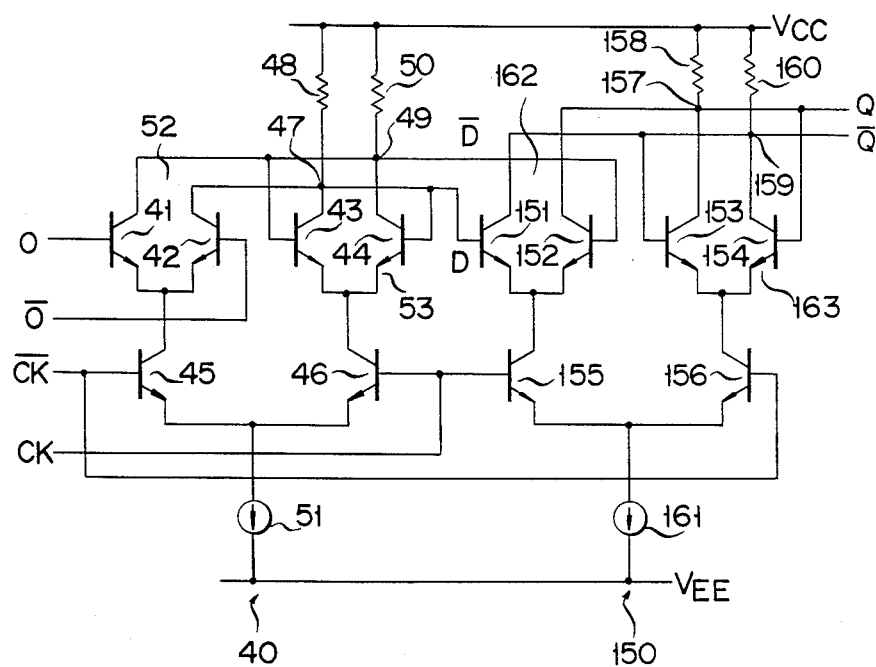

FIGS. 7A and 7B are circuit diagrams of an ECL synchronous logic circuit according to still another embodiment of the present invention. The ECL synchronous logic circuit is obtained by adding a synchronous latch 150 to the circuit shown in FIG. 3. The synchronous latch 150 is operated in a phase opposite to that of the synchronous latch 40. The ECL synchronous logic circuit serves a master-slave flip-flop having an input logic circuit.

The synchronous latch 150 has the following arrangement. The bases of a pair of bipolar npn transistors 151 and 152 receive the output signal D and its inverted signal $\overline{D}$ from the synchronous latch 40, respectively, and the emitters thereof are coupled to each other. The bases and collectors of a pair of bipolar npn transistors 153 and 154 are cross-coupled. The base of the transistor 153 is connected to the collector of the transistor 151, and the base of the transistor 154 is connected to the collector of the transistor 152. The emitters of the transistors 153 and 154 are coupled to each other. The base of a bipolar npn transistor 155 receives the synchronizing signal CK, and the base of a bipolar npn transistor 156 receives the synchronizing signal $\overline{CK}$. The emitters of the transistors 155 and 156 are coupled to each other. The collectors of the transistors 152 and 153 are coupled to each other to constitute a coupling node 157. A resistor 158 is connected as a common load of the transistors 152 and 153 between the node 157 and a high voltage $V_{CC}$. The collectors of the transistors 151 and 154 are coupled to each other to constitute a coupling node 159. A resistor 160 is connected as a common load of the transistors 151 and 154 between the node 159 and the high voltage $V_{CC}$. The collector of the transistor 155 is connected to the emitter-coupling node of the pair of transistors 151 and 152. The collector of the transistor 156 is connected to the emitter-coupling node of the pair of transistors 153 and 154. Similarly, a current source 161 having a resistor, etc., is connected between a low voltage $V_{EE}$ and the emitter-coupling node of the pair of transistors 155 and 156. The nodes 157 and 159 serve as signal output terminals of the synchronous latch 150, respectively. An output signal Q and an inverted output signal $\overline{Q}$ appear at the nodes 157 and 159, respectively.

In the synchronous latch 150, the pair of transistors 151 and 152 and the resistors 158 and 160 constitute a signal transfer circuit 162 which is rendered operative while the synchronizing signal CK is set at level "1". A signal hold circuit 163 is constituted of the pair of transistors 153 and 154 and the resistors 158 and 160 to latch the output signal from the transfer circuit 162 while the synchronizing signal $\overline{CK}$ is set at level "1".

The transfer circuit 162 transfers to the signal hold circuit 163 in the synchronous latch 150 the signals obtained by inverting the holding signals (signals D and $\overline{D}$) in the signal hold circuit 53 in the synchronous latch circuit 40. The transferred signals are stably held by the signal hold circuit 163 in the synchronous latch 150 while the synchronizing signal $\overline{CK}$ is set at level "1".

Therefore, the signals Q and $\overline{Q}$ from the synchronous latch 150 are synchronized with the synchronizing signals CK and $\overline{CK}$, respectively. The circuit of this embodiment serves as a master-slave flip-flop having an input logic circuit.

Figure 8A:
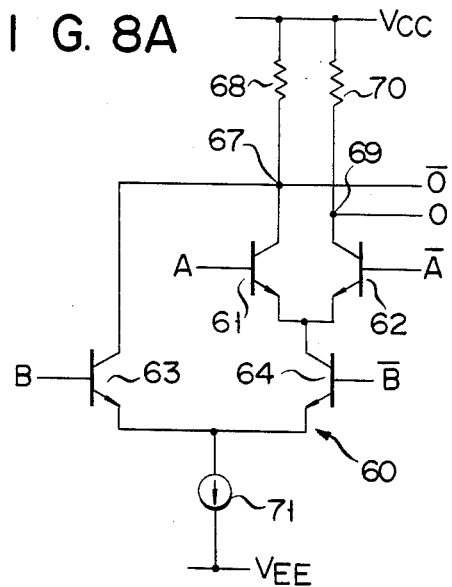
Figure 8B:
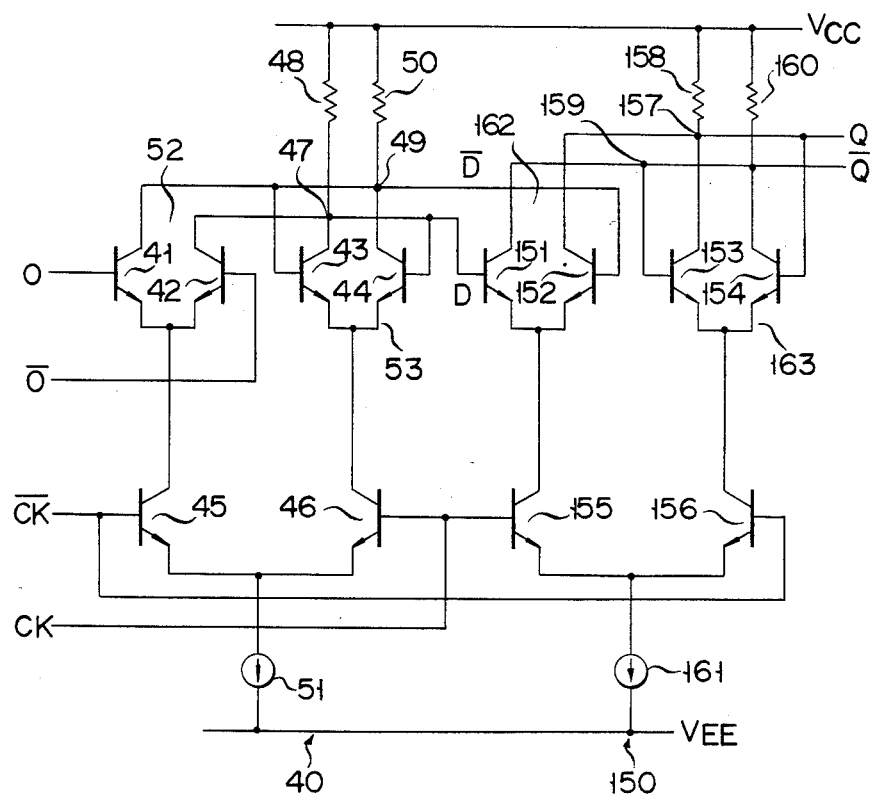

FIGS. 8A and 8B are circuit diagrams of an ECL synchronous logic circuit according to still another embodiment of the present invention. The circuit of this embodiment is obtained by adding a synchronous latch 150 to the circuit in FIG. 4. The synchronous latch 150 is operated in a phase opposite to that of the synchronous latch 40 in the same manner as the circuit in FIGS. 7A and 7B. The circuit in FIGS. 8A and 8B serves as a master-slave flip-flop having an input logic circuit.

Figure 9:
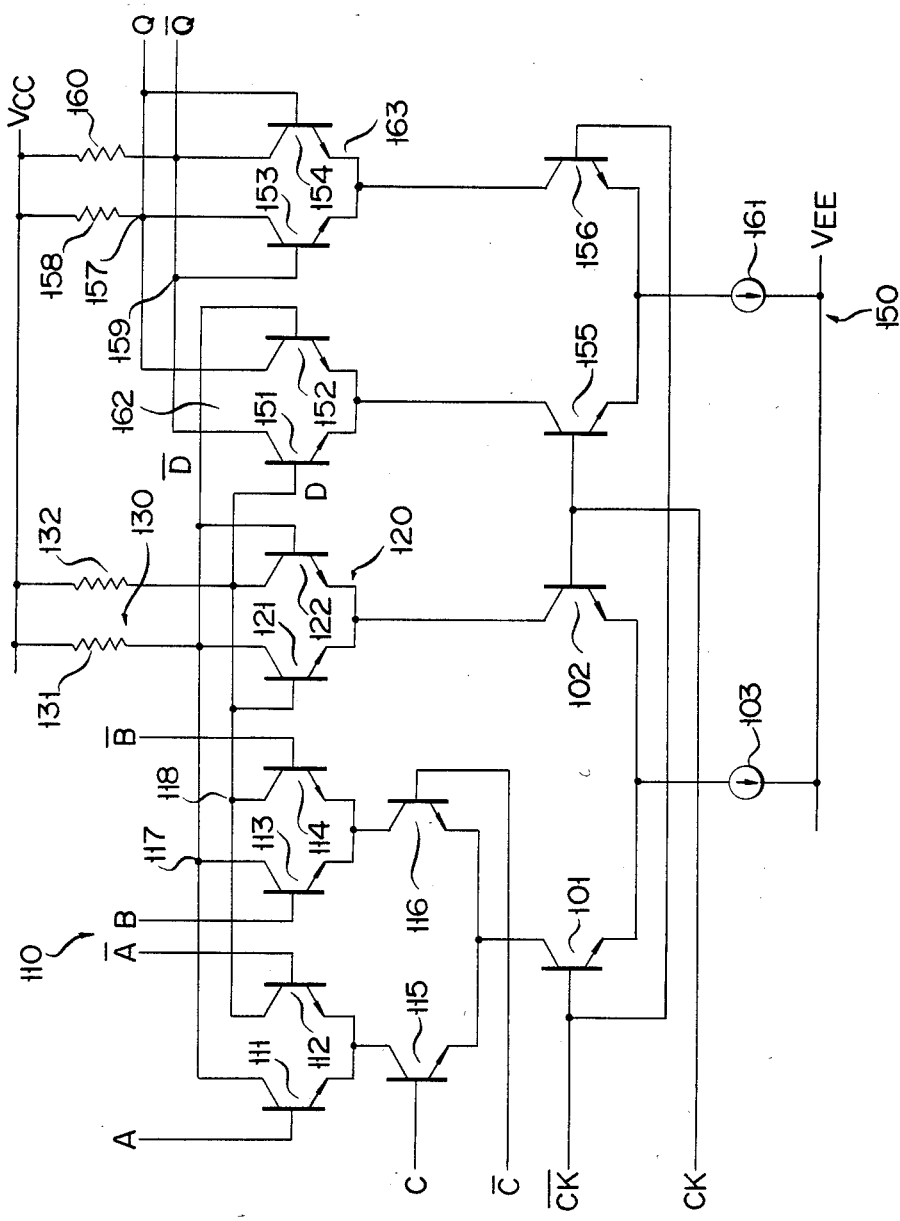

FIG. 9 is a circuit diagram of an ECL synchronous logic circuit according to still another embodiment of the present invention. The circuit of this embodiment is obtained by adding a synchronous latch 150 to the circuit of FIG. 5 in the same manner as in FIGS. 7A and 7B or FIGS. 8A and 8B, thereby obtaining a master-slave flip-flop having an input logic circuit.

Figure 10:
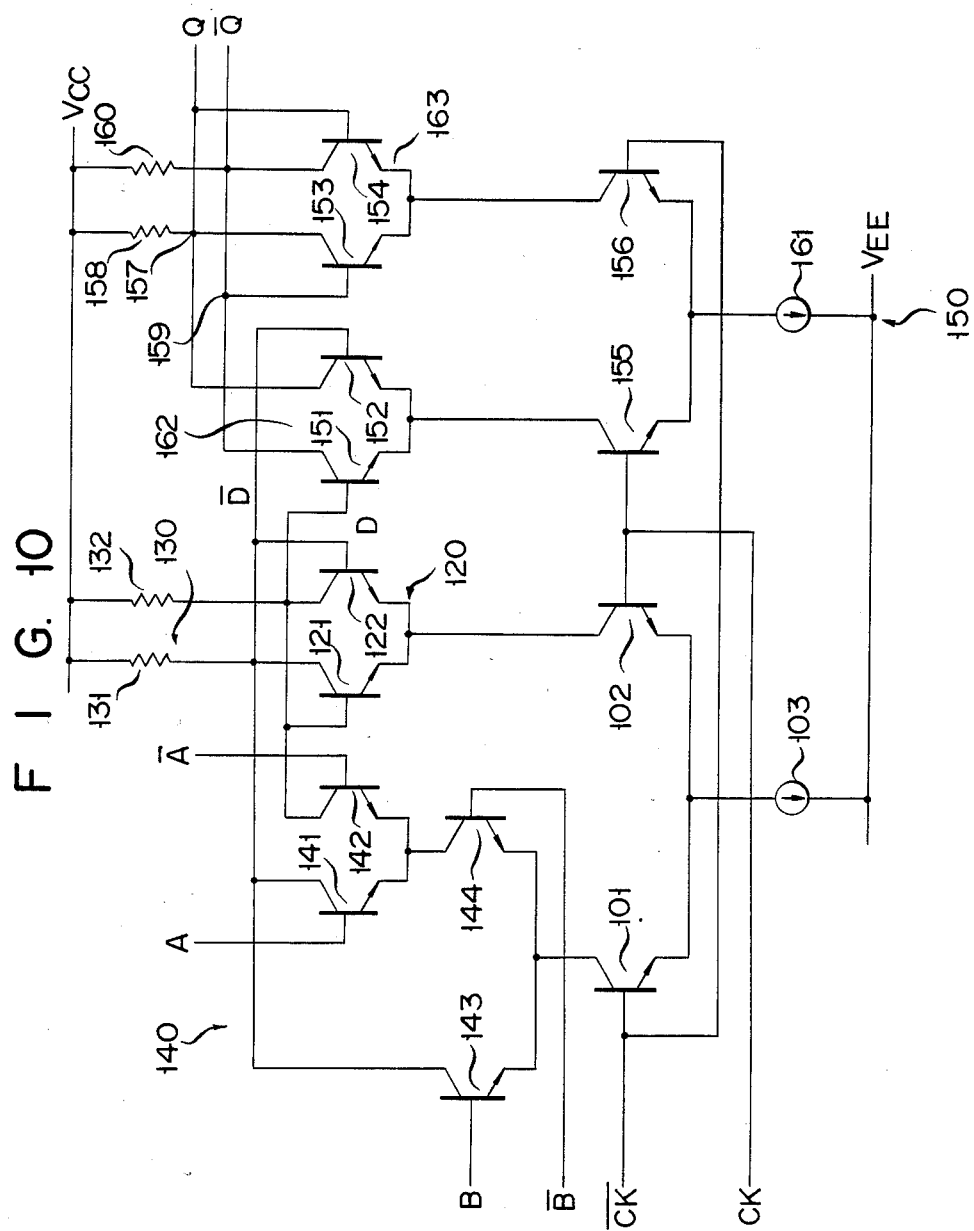

FIG. 10 is a circuit diagram of an ECL synchronous logic circuit according to still another embodiment of the present invention. This circuit is obtained by adding a synchronous latch 150 to the circuit shown in FIG. 6 in the same manner as FIG. 9, thereby constituting a master-slave flip-flop having an input logic circuit.

What is claimed is:

1. An ECL synchronous logic circuit comprising:
   first and second voltage source terminals to receive first and second potentials:
   first and second logic signal output terminals for outputting two logic signals of the opposite phases;
   first and second bipolar transistors whose emitters are coupled to each other and whose bases receive first and second synchronizing signals of the opposite phases, respectively;
   a first current source connected between the emitter node of said first and second bipolar transistors and said first voltage source terminal;
   an input logic circuit comprising third and fourth bipolar transistors whose emitters are coupled to each other and whose bases receive a first logic input signal and the inverted first logic input signal, respectively, and fifth and sixth bipolar transistors whose emitters are coupled to each other and whose bases receive a second logic input signal and the inverted second logic signal, respectively, the emitter node of said third and fourth bipolar transistors being connected to the collector of said first bipolar transistor, the emitter node of said fifth and sixth bipolar transistors being connected to the collector of said fourth bipolar transistor, and the collectors of said third and fifth bipolar transistors being coupled to each other;
   a first signal holding circuit comprising seventh and eighth bipolar transistors whose emitters are coupled to each other and whose bases are connected to the collector of said sixth bipolar transistor and the collector node of said third and fifth bipolar transistors, the base and collector of said seventh bipolar transistor being coupled to the collector and base of said eighth bipolar transistors, respectively;
   a first load element connected between the collector of said seventh bipolar transistor and the second voltage source terminal;
   a second load element connected between the collector of said eighth bipolar transistor and the second voltage terminal;
   ninth and tenth bipolar transistors whose emitters are coupled to each other and whose bases receive the second and first synchronizing signals, respectively;
   a second current source connected between the emitter node of said ninth and tenth bipolar transistors and said first voltage source terminal;
   a signal transfer circuit comprising eleventh and twelfth bipolar transistors whose emitters are coupled to each other, whose bases are connected to the collectors of said eighth and seventh bipolar transistors, respectively, and whose collectors are connected to said first and second logic signal output terminals, respectively, the emitter node of said eleventh and twelfth bipolar transistors being connected to the collector of said ninth bipolar transistor;
   a second signal holding circuit comprising thirteenth and fourteenth bipolar transistors whose emitters are coupled to each other and whose bases are connected to the collectors of said eleventh and twelfth bipolar transistors, respectively, the emitter node of said thirteenth and fourteenth bipolar transistors being connected to the collector of said tenth bipolar transistor and the base and collector of said thirteenth bipolar transistor being connected to the collector and base of said fourteenth bipolar transistor, respectively;
   a third load element connected between said first logic signal output terminal and said second voltage source terminal; and
   a fourth load element connected between said second logic signal output terminal and said second voltage source terminal.

2. An ECL synchronous logic circuit comprising:
   first and second voltage source terminals to receive first and second potentials;
   first and second logic signal output terminals for outputting two logic signals of the opposite phases;
   first and second bipolar transistors whose emitters are coupled to each other and whose bases receive first and second synchronizing signals of the opposite phases, respectively;
   a first current source connected between the emitter node of said first and second bipolar transistors and said first voltage source terminal;
   an input logic circuit comprising third and fourth bipolar transistors whose emitters are coupled to each other and whose bases receive a first logic input signal and the inverted first logic input signal, respectively, fifth and sixth bipolar transistors whose emitters are coupled to each other and whose bases receive a second logic input signal and the inverted second logic signal, respectively, and seventh and eighth bipolar transistors whose emitters are coupled to each other and whose bases receive a third logic input signal and the inverted third logic input signal, respectively, the emitter node of said third and fourth bipolar transistors being connected to the collector of said first bipolar transistor, the emitter node of said fifth and sixth bipolar transistors being connected to the collector of said third bipolar transistor, the emitter node of said seventh and eighth bipolar transistors being connected to the collector of said fourth bipolar transistor, the collectors of said fifth and seventh bipolar transistors being coupled to each other, and the collectors of said sixth and eighth bipolar transistors being coupled to each other;

a first signal holding circuit comprising ninth and tenth bipolar transistors whose emitters are coupled to each other and whose bases are connected to the collector node of said sixth and eighth bipolar transistors and the collector node of said fifth and seventh bipolar transistors, the base and collector of said ninth bipolar transistor being coupled to the collector and base of said tenth bipolar transistors, respectively;

a first load element connected between the collector of said ninth bipolar transistor and the second voltage source terminal;

a second load element connected between the collector of said tenth bipolar transistor and the second voltage source terminal;

eleventh and twelfth bipolar transistors whose emitters are coupled to each other and whose bases receive said second and first synchronizing signals, respectively;

a second current source connected between the emitter node of said eleventh and twelfth bipolar transistors and said first voltage source terminal;

a signal transfer circuit comprising thirteenth and fourteenth bipolar transistors whose emitters are coupled to each other, whose bases are connected to the collectors of said tenth and ninth bipolar transistors, respectively, and whose collectors are connected to said first and second logic signal output terminals, respectively, the emitter node of said thirteenth and fourteenth bipolar transistors being connected to the collector of said eleventh bipolar transistor;

a second signal holding circuit comprising fifteenth and sixteenth bipolar transistors whose emitters are coupled to each other and whose bases are connected to the collectors of said thirteenth and fourteenth bipolar transistors, respectively, the emitter node of said fifteenth and sixteenth bipolar transistors being coupled to the collector of said twelfth bipolar transistor and the base and collector of said fifteenth bipolar transistor being coupled to the collector and base of said sixteenth bipolar transistor, respectively;

a third load element connected between said first logic signal output terminal and said second voltage source terminal; and a fourth load element connected between said second logic signal output terminal and said second voltage source terminal.

* * * * *